United States Patent
Furutachi et al.

(10) Patent No.: US 9,982,155 B2
(45) Date of Patent: May 29, 2018

(54) PHOTOCURABLE ELECTROCONDUCTIVE INK COMPOSITION

(71) Applicant: TANAKA KIKINZOKU KOGYO K.K., Tokyo (JP)

(72) Inventors: Kanako Furutachi, Kanagawa (JP); Rikia Furusho, Kanagawa (JP); Yoshito Imai, Kanagawa (JP); Kenichiro Takaoka, Kanagawa (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days. days.

(21) Appl. No.: 15/318,913

(22) PCT Filed: Jun. 22, 2015

(86) PCT No.: PCT/JP2015/067822
§ 371 (c)(1),
(2) Date: Dec. 14, 2016

(87) PCT Pub. No.: WO2016/002550
PCT Pub. Date: Jan. 7, 2016

(65) Prior Publication Data
US 2017/0137655 A1 May 18, 2017

(30) Foreign Application Priority Data

Jul. 3, 2014 (JP) ................. 2014-137344

(51) Int. Cl.
| | |
|---|---|
| C08F 2/46 | (2006.01) |
| C08F 2/50 | (2006.01) |
| C08G 61/04 | (2006.01) |
| C09D 11/52 | (2014.01) |
| C09D 11/101 | (2014.01) |
| C09D 11/105 | (2014.01) |
| H01B 1/22 | (2006.01) |
| H01B 5/14 | (2006.01) |
| H01B 13/00 | (2006.01) |
| H05K 3/12 | (2006.01) |
| B41F 15/06 | (2006.01) |
| C09D 11/03 | (2014.01) |
| C09D 11/107 | (2014.01) |
| H05K 1/09 | (2006.01) |
| H05K 3/22 | (2006.01) |
| C09D 11/037 | (2014.01) |

(52) U.S. Cl.
CPC .............. *C09D 11/52* (2013.01); *B41F 15/06* (2013.01); *C09D 11/03* (2013.01); *C09D 11/037* (2013.01); *C09D 11/101* (2013.01); *C09D 11/105* (2013.01); *C09D 11/107* (2013.01); *H01B 1/22* (2013.01); *H01B 5/14* (2013.01); *H01B 13/00* (2013.01); *H05K 1/095* (2013.01); *H05K 3/12* (2013.01); *H05K 3/1216* (2013.01); *H05K 3/22* (2013.01); *H05K 2203/0514* (2013.01)

(58) Field of Classification Search
CPC ....... C09D 11/52; C09D 11/03; C09D 11/105; C09D 11/101; C09D 11/107; H05K 1/095; H05K 3/22; H05K 3/1216; H05K 2203/0514; B41F 15/06
USPC .................. 522/7, 6, 71, 189, 184, 1; 520/1
See application file for complete search history.

(56) References Cited

U.S. PATENT DOCUMENTS

2014/0151606 A1  6/2014  Lowenthal et al.

FOREIGN PATENT DOCUMENTS

| WO | WO 2008/077060 A1 | 6/2008 | |
|---|---|---|---|
| WO | WO-2013061980 A1 * | 5/2013 | ............... H01B 1/22 |

OTHER PUBLICATIONS

Furusho et al, WO 2013/061980 Machine Translation, May 2, 2013 (Year: 2013).*
Extended European Search Report for European application No. 15816002.8, dated Nov. 6, 2017.

* cited by examiner

*Primary Examiner* — Jessica Whiteley
(74) *Attorney, Agent, or Firm* — Orrick, Herrington & Sutcliffe LLP; Joseph A. Calvaruso

(57) ABSTRACT

[Problem] Provided is a photocurable electroconductive ink composition for screen printing which can provide printability, printing precision and adhesiveness on a substrate good enough for screen printing, and can show stable electroconductive properties.
[Solution] A photocurable electroconductive ink composition for screen printing, comprising: (A) an electroconductive filler, (B) a photopolymerizable resin precursor consisting of an oligomer of urethane acrylate, monofunctional acrylate and polyfunctional acrylate, (C) an alkyd resin, (D) two or more photopolymerization initiators and (E) a polymer dispersant, in which the content of the electroconductive filler (A) is 70 to 90 mass % relative to the total mass of the photocurable electroconductive ink composition, and more than 50 mass % of the electroconductive filler is silver powder in a scale-like, foil-like or flake-like form having a particle diameter at 50 % particle size distribution of 0.3 to 3.0 μm, and the total content of the photopolymerizable resin precursor (B) is 10 to 24 mass % relative to the total mass of the photocurable electroconductive ink composition, and the content of the oligomer of urethane acrylate is 5 mass % or less relative to the total mass of the photocurable electroconductive ink composition, and the content of the alkyd resin (C) is 1 to 10 mass % relative to the total mass of the photocurable electroconductive ink composition.

15 Claims, No Drawings

PHOTOCURABLE ELECTROCONDUCTIVE INK COMPOSITION

TECHNICAL FIELD

The present invention relates to a photocurable electroconductive ink composition used for screen printing. More specifically, the present invention relates to a photocurable electroconductive ink composition for screen printing which can be cured with an active energy ray such as ultraviolet light without applying heat, and can provide good printing precision and adhesiveness as well as stable electric conduction when used for forming electronic circuits on various substrates by screen printing.

BACKGROUND ART

The "printed electronics technology," which is known as a technology for manufacturing electronic devices by taking advantage of printing techniques (screen printing, flexographic printing, gravure printing and the like), has been attracting attention as a next-generation printing technology. This technology has been actively studied in recent years as it has a potential to meet those demands for lighter, smaller, more flexible and/or larger-area electronic devices as well as those demands such as cost reduction, mass production, energy conservation, chemical-usage reduction and the like. Indeed, the printed electronics technology has already yielded a wide variety of products in practical use such as membrane switches, wirings in RF-ID, displays, flexible solar cells, sensors and electronic papers, and will certainly create even larger markets and economic effects in the future.

Meanwhile, when the printed electronics technology is used to print an electronic circuit on a substrate with an electroconductive ink, a conventional electroconductive ink needs to be cured or dried by applying heat at about 50 to 120° C. at lowest. This means that a heating process is a mandatory requirement for conventional electroconductive inks.

Electroconductive inks which require heating, however, can not be applied to heat-sensitive substrates such as PET films. In view of the above, a challenge in the printed electronics technology is to develop an electroconductive ink which does not require heating so that circuits can be formed even on heat-sensitive substrates.

Accordingly, an electroconductive ink has been developed which can be cured only with ultraviolet light without applying heating after applied on a substrate to form an electronic circuit. An electroconductive ink curable only by the action of ultraviolet light can omit a heating process, and also provide a large number of advantages such as high productivity, low pollution, good work environment (VOC-free) and good printing quality (high hardness, weather resistance). As an example of such an ultraviolet-curable electroconductive ink, Patent Document 1 describes a composition including a polymerizable compound, a photosensitizer, an electrically conductive substance and saturated copolymerized polyester soluble in a predetermined phosphorus compound and the polymerizable compound, in which the polymerizable compound and the phosphorus compound are blended in a predetermined proportion.

As another example, Patent Document 2 discloses a composition as a UV-curable electroconductive ink suitable for flexographic printing, rotogravure printing and the like, the composition including one or more oligomers such as urethane acrylate, one or more acrylate carriers such as diacrylate and triacrylate, one or more reactive monomers such as vinyl ether, one or more electroconductive fillers such as flake-like silver powder and one or more photoinitiators.

Further, Patent Document 3 discloses an active energy ray-curable electroconductive ink composition as an electroconductive ink suitable for flexographic printing and screen printing, the composition including electrically conductive powder, an active energy ray-curable resin and a diluent as essential components, in which the active energy ray-curable resin consists of polyfunctional urethane acrylate.

Many of the conventional electroconductive inks, however, tend to cause transfer errors and blurrings when the content of an electroconductive filler is increased in an attempt to achieve a good electric conductivity. This may result in problems of printability, printing precision and the like such as no conductivity after post transfer-printing curing.

Moreover, an increased content of an electroconductive filler may prevent ultraviolet light from reaching the entire electroconductive ink, resulting in curability problems such as failed curing of a printed electroconductive ink at a deep portion.

In addition, a presence of ozone at the surface of a substrate, which may be generated from oxygen by the action of light having a wavelength of 220 nm or less, may inhibit curing when curing is performed with ultraviolet light, resulting in a problem of insufficient curing.

Accordingly, the present applicant previously disclosed a photocurable electroconductive ink composition in Patent Document 4 which overcomes the above problems, the compound including (A) an oligomer of urethane acrylate, (B) three types of acrylates consisting of any one of tetrafunctional acrylate or trifunctional acrylate, bifunctional acrylate and monofunctional acrylate, (C) an electroconductive filler, (D) two or more photopolymerization initiators selected from 1-hydroxycyclohexyl phenyl ketone, bis(2,4,6-trimethylbenzoyl)-phenylphosphine oxide, 2-methyl-1-(4-methylthiophenyl)-2-morpholinopropane-1-one, benzophenone and 2,4-diethylthioxanthone and (E) a polymer dispersant, in which the content of the electroconductive filler (C) is 77 to 85 mass % relative to the total mass of the photocurable electroconductive ink composition, and 80 mass % or more of the electroconductive filler (C) is silver powder in a scale-like, foil-like or flake-like form having a particle diameter at 50% particle size distribution of more than 5 μm.

CITATION LIST

Patent Document
Patent Document 1: Japanese Examined Patent Application Publication No. 03-44082
Patent Document 2: Japanese Unexamined Patent Application Publication No. 2008-260938
Patent Document 3: Japanese Unexamined Patent Application Publication No. 2007-119682
Patent Document 4: Japanese Patent No. 5043226

SUMMARY OF INVENTION

Technical Problem

The photocurable electroconductive ink composition disclosed in Patent Document 4 as described above shows good printability, printing precision and adhesiveness on substrates as well as stable electroconductive properties, and is particularly suitable for high-speed printing methods such as flexographic printing, offset printing and gravure printing. Note that depending on a printing method to be used, an electroconductive ink is required to meet demanded performance therefor.

Screen printing, which is one of the various printing methods used in practical, represents a typical printing method in which a mimeograph (a screen plate) is used. It is a printing method including: positioning a substrate (a target for printing) under a screen plate, placing an ink over the upper surface of the screen plate, and sliding an elastic spatula called a squeegee while pressing the spatula down against the upper surface to force the ink to extrude through the pores, thereby transferring the ink to the target for printing. Unlike high-speed printing such as flexographic printing, screen printing has a relatively slow printing speed, and thus is suitable for printing small to medium scale products rather than mass-produced goods. Further, unlike an ink used for high-speed printing such as flexographic printing, an ink used for screen printing commonly has a high viscosity, and may form a thick ink-coating film when applied on a substrate.

In addition, screen printing uses a highly flexible screen plate, and usually shows a very low printing pressure, and thus can be applied to a wide range of substrates. Further, an appropriate ink can most likely be found and used to obtain a required functionality because a broad range of inks can be used for screen printing. In particular, it is a representative printing method for applying a functional ink. Moreover, it is suitable for short life-cycle products and custom-made products with different designs, and particularly advantageous for manufacturing products of many kinds in small quantities because the plate-making step is simple, and a screen plate can be produced at low cost.

As described above, screen printing has many advantages which other printing methods do not have, and is used for a wide range of products.

Nonetheless, a printed circuit is very difficult to be cured with ultraviolet light alone without applying heat when the circuit is formed by screen printing. This is, for example, because an ink coating film applied on a substrate is relatively thick, and the viscosity of an ink is large unlike high-speed printing such as flexographic printing. Most of electroconductive inks currently used for screen printing actually require heating for being cured. Therefore, good printability and curability can not be obtained when a relatively less viscous electroconductive inks used in high-speed printing such as flexographic printing are directly used in screen printing for different purposes, uses and the like.

In view of these circumstances, an object of the present invention is to provide a photocurable electroconductive ink composition for screen printing, in which the composition can instantaneously be cured only by applying an energy ray such as ultraviolet light without applying heating, and the composition can provide good printability, printing precision and adhesiveness on substrates and shows stable electroconductive properties so that high-definition printing can be achieved without transfer errors and blurrings.

Solution to Problem

The present inventors have focused on an alkyd resin as a component of an electroconductive ink, and have conducted extensive studies to solve the above problems. Then the present invention has been completed.

That is, the present invention provides a photocurable electroconductive ink composition for screen printing, the composition includes:

(A) an electroconductive filler,
(B) a photopolymerizable resin precursor consisting of an oligomer of urethane acrylate; monofunctional acrylate; and polyfunctional acrylate,
(C) an alkyd resin,
(D) two or more photopolymerization initiators and
(E) a polymer dispersant, and
in which the content of the electroconductive filler (A) is 70 to 90 mass % relative to the total mass of the photocurable electroconductive ink composition, and 50 mass % or more of the electroconductive filler is silver powder in a scale-like, foil-like or flake-like form having a particle diameter at 50% particle size distribution of 0.3 to 3.0 μm, and the content of the photopolymerizable resin precursor (B) is 10 to 24 mass % relative to the total mass of the photocurable electroconductive ink composition, and the content of the oligomer of urethane acrylate is 5 mass % or less relative to the total mass of the photocurable electroconductive ink composition, and the content of the alkyd resin (C) is 1 to 10 mass % relative to the total mass of the photocurable electroconductive ink composition.

Advantageous Effect of Invention

The photocurable electroconductive ink composition according to the present invention can be cured only by applying ultraviolet light and the like at room temperature without heating when used in screen printing, and thus can be applied on heat-sensitive substrates such as plastics. Further, the photocurable electroconductive ink composition according to the present invention can provide good printability, printing precision and adhesiveness for various substrates, and can also show stable electroconductive properties.

DESCRIPTION OF EMBODIMENT

The basic composition of the photocurable electroconductive ink composition according to the present invention consists of the electroconductive filler (A), the photopolymerizable resin precursor (B), the alkyd resin (C), the photopolymerization initiators (D) and the polymer dispersant (E) as described above. First, each component will be described in detail.

The component (A) is an electroconductive filler. In the photocurable electroconductive ink composition according to the present invention, 50 mass % or more of the electroconductive filler (A) is silver powder in a scale-like, foil-like or flake-like form having a particle diameter at 50% particle size distribution (PSD) of 0.3 to 3.0 μm. When silver powder in a form different from those described above accounts for 50 mass % or more of the total mass of the electroconductive filler, sufficient curability, electric conductivity and fluidity may not be obtained. Further, a particle diameter at 50% particle size distribution of less than 0.3 μm may tend to cause immediately aggregated silver powder and increased viscosity after production of the electroconductive ink composition, and may also reduce post-printing adhesiveness due to insufficient photopolymerization reactions. On the other hand, a particle diameter at 50% particle size distribution of more than 3.0 μm may cause clogging of a screen plate, resulting in decreased workability. Note that the particle diameter at 50% particle size distribution can be measured by well-known methods, for example, dynamic light scattering (DLS), laser diffraction, sedimentation and the like.

As silver powder for the electroconductive filler (A), pure-silver powder, metal particles coated with silver on the surface or a mixture thereof can be used. There is no particular limitation for a method of manufacturing silver powder, and any can be used such as the mechanical pulverization method, the reductive method, the electrolytic method and the gas phase method. A metal particle coated with silver on the surface refers to a particle made of a metal other than silver in which a silver coating layer is formed on the surface of the particle by a method such as plating.

There is no particular limitation for another electroconductive filler which may be used together with the silver powder in a scale-like, foil-like or flake-like form having a particle diameter at 50% particle size distribution (PSD) of 0.3 to 3.0 μm that is accounted for 50 mass % or more of the electroconductive filler (A) as long as it has electric conductivity, but it is preferably a metal, a carbon nanotube or the like. Powder of any metal considered as a common conductor can be used as that metal. Examples can include nickel, copper, silver, gold, aluminum, chromium, platinum, palladium, tungsten and molybdenum alone, alloys including two or more of these, materials coated therewith, compounds thereof having good electric conduction and the like. Among these, preferably used is spherical powder of pure silver or spherical metal powder coated with silver on the surface thereof.

The content of the electroconductive filler (A) is 70 to 90 mass % relative to the total mass of the photocurable electroconductive ink composition according to the present invention. A content of less than 70 mass % may result in insufficient electric conduction while a content of more than 90 mass % may result in difficult control of low viscosity. The content is preferably 70 to 85 mass %. According to the photocurable electroconductive ink composition according to the present invention, in which a relatively large amount of the electroconductive filler (A) is contained as compared with the conventional conductive pastes, and the particle diameter at 50% particle size distribution and the form of the silver powder are specified as described above, good printability can be obtained although the larger amount of the electroconductive filler is contained, and good electric conduction can also be obtained without losing an electrical connection by virtue of rapidly proceeding radical polymerization reactions upon curing with ultraviolet light.

The component (B) is a photopolymerizable resin precursor consisting of an oligomer of urethane acrylate; monofunctional acrylate and polyfunctional acrylate. The basic structure of the oligomer of urethane acrylate is composed of a soft segment (a polyol part) located in the central portion of the molecular chain, and hard segments (an acrylate part and an isocyanate part) located at the both ends of the molecular chain. The oligomer of urethane acrylate forms a crosslinked polymer network structure along with the monofunctional acrylate and polyfunctional acrylate which constitutes the component (B), and can rapidly form a flexible, robust film having an excellent adhesiveness with a substrate. Further, according to the present invention in which the combination of an oligomer of urethane acrylate; monofunctional acrylate; and polyfunctional acrylate is used, low viscosity can be maintained, and interference in a photopolymerization reaction can be prevented although the content of the electroconductive filler (A) is large. Thereby, good printability and printing precision as well as stable electric conduction can be obtained.

The oligomer of urethane acrylate can be obtained by allowing an isocyanate compound, a polyhydric alcohol such as an ester-based polyol and a hydroxy group-containing acrylate to react. The term "oligomer" as used herein refers to a polymer in which two to tens of monomeric units are repeated. Note that the term "acrylate" as used herein means that it encompasses both acrylate and methacrylate. Further, the number of acrylate functional groups contained in one oligomer molecule is preferably 3 or more. That is, polyfunctionality is preferred.

Examples of the oligomer of urethane acrylate can include, for example, Aronix M-1100, M-1200, M-1210, M-1310, M-1600, M-1960 from Toagosei Colo., Ltd.; R1204, R1211, R1213, R1217, R1218, R1301, R1302, R1303, R1304, R1306, R1308, R1901, R1150 and the like from DKS Co. Ltd.; EBECRYL 230, 270, 4858, 8402, 8804, 8807, 8803, 9260, 1290, 1290K, 5129, 4842, 8210, 210, 4827, 6700, 4450, 220 and the like from Daicel Cytec Colo., Ltd.; NK Oligo U-4HA, U-6HA, U-15HA, U-108A, U200AX and the like from Shin-Nakamura Chemical Co., Ltd.

The content of the oligomer of urethane acrylate is 5 mass % or less relative to the total mass of the photocurable electroconductive ink composition according to the present invention. A content of more than 5 mass % may increase viscosity, resulting in decreased workability (printability).

The component (B) is composed of monofunctional acrylate and at least one polyfunctional acrylate in addition to an oligomer of urethane acrylate as described above. The at least one polyfunctional acrylate includes at least one acrylate selected from tetrafunctional acrylate, trifunctional acrylate and bifunctional acrylate. In particular, the photocurable electroconductive ink composition according to the present invention preferably contains the at least one polyfunctional acrylate including any one of tetrafunctional acrylate or trifunctional acrylate; and bifunctional acrylate as essential components. That is, as the at least one polyfunctional acrylate, preferred are the combination of tetrafunctional acrylate and bifunctional acrylate, the combination of trifunctional acrylate and bifunctional acrylate or the combination of all of tetrafunctional acrylate, trifunctional acrylates and bifunctional acrylate. Most suitably, as the at least one polyfunctional acrylate, used is the combination of any one of tetrafunctional acrylate or trifunctional acrylate; and bifunctional acrylate.

Examples of the above tetrafunctional acrylate can include pentaerythritol tetraacrylate, ditrimethylolpropane tetraacrylate, ethoxylated pentaerythritol tetraacrylate, ethylene oxide-modified diglycerin tetraacrylate and the like. These may be used alone or in a combination of two or more.

Examples of the above trifunctional acrylate can include trimethylolpropane triacrylate, glycerol triacrylate, ethylene oxide-modified trimethylolpropane triacrylate, pentaerythritol triacrylate, tris(2-hydroxyethyl)isocyanurate triacrylate, propoxylated glyceryl triacrylate and the like. These may be used alone or in a combination of two or more.

Examples of the above bifunctional acrylate can include ethylene glycol diacrylate, diethylene glycol diacrylate, triethylene glycol diacrylate, tetraethylene glycol diacrylate, polyethylene glycol (200) diacrylate, polyethylene glycol (400) diacrylate, polyethylene glycol (600) diacrylate, polyethylene glycol (1000) diacrylate, polypropylene glycol (400) diacrylate, polypropylene glycol (700) diacrylate, 1,3-butanediol diacrylate, 1,4-butanediol diacrylate, 1,6-hexanediol diacrylate, 1,9-nonanediol diacrylate, neopentyl glycol diacrylate, polytetramethylene glycol diacrylate, propoxylated neopentyl glycol diacrylate, dimethylol tricyclodecane diacrylate, bisphenol A-ethylene oxide adduct diacrylate, hydroxypivalate neopentylglycol diacrylate and the like. These may be used alone or in a combination of two or more.

Examples of the above monofunctional acrylate can include methyl acrylate, ethyl acrylate, propyl acrylate, butyl acrylate, isobutyl acrylate, amyl acrylate, hexyl acrylate, 2-ethylhexyl acrylate, octyl acrylate, isooctyl acrylate, nonyl acrylate, dodecylacrylate, hexadecyl acrylate, octadecyl acrylate, cyclohexyl acrylate, benzyl acrylate, methoxyethyl acrylate, butoxyethyl acrylate, phenoxyethyl acrylate, nonylphenoxyethyl acrylate, glycidyl acrylate, dimethylaminoethyl acrylate, diethylaminoethyl acrylate, bornyl acrylate, isobornyl acrylate, dicyclopentanyl acrylate, dicyclopentenyl acrylate, dicyclopentenyloxyethyl acrylate, tetrahydrofurfuryl acrylate and the like. These may be used alone or in a combination of two or more.

The content of the photopolymerizable resin precursor (B) is preferably 10 to 24 mass %, in particular preferably 12 to 24 mass % relative to the total mass of the photocurable electroconductive ink composition according to the present invention. A content of less than 10 mass % may decrease curability while a content of more than 24 mass % may cause problems in workability (printability).

In a case where a portion except for the oligomer of urethane acrylate in the photopolymerizable resin precursor (B) is composed of the combination of tetrafunctional acrylate, bifunctional acrylate and monofunctional acrylate or the combination of trifunctional acrylate, bifunctional acrylate and monofunctional acrylate, the content of tetrafunctional acrylate or trifunctional acrylate is preferably 2 to 12 mass %, more preferably 2 to 10 mass % relative to the total mass of the photopolymerizable resin precursor (B) in view of workability (printability, viscosity). Most suitably, it is 2 to 10 mass %.

Moreover, in a case where a portion except for the oligomer of urethane acrylate in the photopolymerizable resin precursor (B) is composed of tetrafunctional acrylate, trifunctional acrylate, bifunctional acrylate and monofunctional acrylate, the total amount of tetrafunctional acrylate and trifunctional acrylate is preferably 2 to 12 mass %, more preferably 2 to 10 mass % relative to the total mass of the photopolymerizable resin precursor (B) in view of adhesiveness/flexibility. Most suitably, it is 2 to 10 mass %.

The component (C) is an alkyd resin. According to the present invention, a blended alkyd resin can serve to reduce problematic ink bleeding at printed lines and the like when screening printing is performed, and can also serve to produce an excellently smoothed printed surface. The term "alkyd resin" as used in the present invention refers to a synthetic resin which can be obtained by a condensation reaction of polyhydric alcohol with polybasic acid (or acid anhydride).

Examples of the above polyhydric alcohol can include dihydric alcohols such as ethylene glycol, diethylene glycol, triethylene glycol, propylene glycol, trimethylene glycol, tetramethylene glycol and neopentyl glycol, trihydric alcohols such as glycerin, trimethylolethane and trimethylolpropane, as well as diglycerin, triglycerin, pentaerythritol, dipentaerythritol, mannite, sorbitol and the like.

Examples of the above polybasic acid (or acid anhydride) can include phthalic anhydride, isophthalic acid, terephthalic acid, succinic acid, adipic acid, sebacic acid, tetrahydro phthalic anhydride and maleic anhydride as well as polybasic acids (or acid anhydrides) synthesized by the Diels-Alder reaction.

As the alkyd resin (C), those modified with modifiers such as fatty oils (or fatty acids), natural resins and synthetic resins, i.e., modified alkyd resins are preferably used. A modified alkyd resin has a structure in which a modified portion derived from a modifier is introduced as a side chain into a polyester backbone obtained by a condensation reaction of polyhydric alcohol with polybasic acid (or acid anhydride). The alkyd resin (C) is preferably a fatty oil-modified alkyd resin.

With regard to the above modifiers, examples of the fatty oils (or fatty acids) can include drying oils such as linseed oil, tung oil, poppy oil, perilla frutescens crispa oil, walnut oil, perilla ocimoides oil, safflower oil and sunflower oil; semi-drying oils such as soybean oil, rice bran oil, corn oil, cotton seed oil and sesame oil; non-drying oils such as olive oil, almond oil, peanut oil, coconut oil, camellia oil, rapeseed oil, castor oil and dehydrated castor oil; and fatty acids contained therein and the like. Among these, coconut oil is particularly suitable for the present invention.

Examples of the natural resins can include rosin, copal, amber, shellac and the like.

Examples of the synthetic resins can include ester gum, phenol resins, urea resins, melamine resins, epoxy resins, silicone resins and the like.

The alkyd resin (C) is preferably an alkyd resin inactive in a photopolymerization reaction (a non-photopolymerizable alkyd resin). Use of an alkyd resin active in a photopolymerization reaction may decrease the surface smoothness of a printed coating film. Examples of an alkyd resin inactive in a photopolymerization reaction can include, for example, Phthalkyd 926-70 and the like.

Examples of the alkyd resin (C) can include, for example, Phthalkyd 133-60, Phthalkyd 133-60S, Phthalkyd M132-60, Phthalkyd X450, Phthalkyd 444-50, Phthalkyd 444-50T, Phthalkyd 803-70, Phthalkyd 804-70A, Phthalkyd 806-65, Phthalkyd 926-70, Phthalkyd 926-80A, Phthalkyd 930-70D, Phthalkyd 970-80, Phthalkyd 970-80X, Phthalkyd 937-60T, Phthalkyd 235-50, Phthalkyd 235-60LV, Phthalkyd 237-60A, Phthalkyd 213-60, Phthalkyd 220-50, Phthalkyd 640-50, Phthalkyd 640-60, Phthalkyd X483, Phthalkyd X468, Phthalkyd X254, Phthalkyd D653G, Phthalkyd D641E-5, Phthalkyd D680, Phthalkyd DX615, Phthalkyd D634S, Phthalkyd D686, Phthalkyd P552, Phthalkyd X414, Phthalkyd P563, Phthalkyd P571, Phthalkyd D682, Phthalkyd D683, Phthalkyd V901, Phthalkyd V903, Phthalkyd V916D, Phthalkyd V917, Phthalkyd V932, Phthalkyd V904, Phthalkyd EX105D, Phthalkyd EX101-10, Phthalkyd EX110 and the like from Hitachi Chemical Co., Ltd.; Beckosol 1323-60-EL, Beckosol OD-E-230-70, Beckosol OD-E-240-70, Beckosol 1308, Beckosol ER-3400-60, Beckosol ER-3600-60, Beckosol ER-3653-60, Beckosol ER-4005-60, Beckosol 50-594-80, Beckosol EZ-3509-60, Beckosol EZ-3531-80, Beckosol ET-3300-60X, Beckosol ET-3604-60, Beckosol 1307-60-EL, Beckosol 1343, Beckosol EZ-3020-60, Beckosol ET-3061-P, Beckosol EY-4006-60, Beckosol J-524-IM-60, Beckosol EZ-3530-80, Beckosol EY-3002-65, Beckosol 57-1362, Beckosol CB-931, Beckosol OD-E-198-50, Beckosol 45-463, Beckosol ES-4020-55, Beckosol EL-4501-50, ES-5003-50, Beckosol ES-5004-50, Beckosol J-557, Beckosol 15-146, Beckosol, Beckosol 17-999, Beckosol 1334-EL, Beckosol EL-5007 Beckosol ES-5103-50X, Super Beckosol ES-4012, Beckosol P-470-70, Beckosol ES-6012-60, Beckosol ES-6505-70, Beckosol ES-6015-60, Beckosol ET-6502-60, Beckosol EL-6501-70, Beckosol J-510, Beckosol No. 1 Solution, Beckosol 1341, Beckosol P-271, Beckosol J-611, Beckosol J-608, Beckosol P-539, Beckosol M-2151, Beckosol M-2155, Beckosol TD-50-30, Beckosol M-9201, Styresol 4250, Styresol 4400, Styresol 4440, Styresol J-719, Styresol M-1159, Styresol M-1170, P-786-50, Watersol S-311, Watersol S-346, Watersol S-333, Watersol S-319-HV, Watersol S-326, Watersol CD-520, Watersol S-123, Watersol S-126, Watersol S-196, Watersol S-117, Watersol S-118, Watersol S-145, Watersol S-346 and the like from DIC Corporation; Hariphthal 915-60L, Hariphthal 912-60, Hariphthal 935-60, Hariphthal LOG42-60X, Hariphthal COG40-50T, Hariphthal 732-60, Hariphthal 1111-60HV, Hariphthal SB-7123, Hariphthal 698X, Hariphthal SFG42-60X, Hariphthal H-302T, Hariphthal SB-7540, Hariphthal SB-7150, Hariphthal TFP30-50HV, Hariphthal 223, Hariphthal 3271, Hariphthal 3371, Hariphthal 309LV, Hariphthal 309-60, Hariphthal 3011, Hariphthal 3004, Hariphthal SC-3128TX, Hariphthal 3190-45, Hariphthal 3100, Hariphthal SC-3211, Hariphthal 3150, Hariphthal X-1000, Hariphthal SC3059TX, Hariphthal 3261, Hariphthal MS-4234, Hariphthal 816, Hariphthal KL-912, Hariphthal SL-1230, Hariphthal SL-3500, Hariphthal 764-60, Hariphthal BOP208-705, Hariphthal 240G, Hariphthal SL-889, Hariphthal 655, Hariphthal 678, Hariphthal 601, Hariphthal 1155, Hariphthal KV-905, Hariphthal 6101, Hariphthal 193HV, Hariphthal 3011PN, Hariphthal 3254PN, Hariphthal 3256P, Hariphthal 6000, Haridip AD-103, Haridip BK-77, Haridip H-541, Haridip L-116AM from Harima Chemicals Group, Inc.; Arakyd 5001, Arakyd 6300 and the like from Arakawa Chemical Industries, Ltd.

The content of the alkyd resin (C) is 1 to 10 mass % relative to the total mass of the photocurable electroconductive ink composition according to the present invention. A content of less than 1 mass % may decrease the surface smoothness of a printed coating film while a content of more than 10 mass % may decrease printability.

The photopolymerization initiators as the component (D) can absorb applied ultraviolet light, and generate a radical to initiate a photopolymerization reaction. There is no particular limitation for the photopolymerization initiators as long as they can serve to initiate radical polymerization by photoexcitation. Examples of a photopolymerization initiator which can be used can include molecule cleavage types such as benzoin, benzoin ethyl ether, benzoin isopropyl ether, benzoin isobutyl ether, 2,4-diethyl thioxanthone, 2-isopropyl thioxanthone, benzyl, 2,4,6-trimethylbenzoyl diphenylphosphine oxide 6-trimethylbenzoyl diphenylphosphine oxide, 2-benzyl-2-dimethylamino-1-(4-morpholinophenyl)-butan-1-one, bis(2,6-dimethoxybenzoyl)-2,4,4-trimethylpentylphosphine oxide, bis(2,4,6-trimethylbenzoyl)-phenylphosphine oxide, 2,4,4-trimethylpentylphosphine oxide, 1-hydroxycyclohexylphenyl ketone, benzoin alkyl ether, benzyl dimethyl ketal, 2-hydroxy-2-methyl-1-phenylpropan-1-one, 1-(4-isopropylphenyl)-2-hydroxy-2-methylpropan-1-one and 2-methyl-1-(4-methylthiophenyl)-2-morpholinopropan-1-one; and hydrogen withdrawing types such as benzyl, benzophenone, 4-phenylbenzophenone, isophthalphenone, 2-ethylanthraquinone, 2,4-diethylthioxanthone and 4-benzoyl-4'-methyl-diphenylsulfide.

The photocurable electroconductive ink composition according to the present invention includes at least two photopolymerization initiators. Use of two or more photopolymerization initiators in combination can provide good printability, printing precision and high-speed printability. Preferred combinations of photopolymerization initiators among those described above are combinations of at least two selected from 1-hydroxycyclohexylphenyl ketone, bis(2,4,6-trimethylbenzoyl)-phenylphosphine oxide, 2-methyl-1-(4-methylthiophenyl)-2-morpholinopropan-1-one, benzophenone and 2,4-diethylthioxanthone. In particular, these combinations enable good printability and printing precision.

There is no particular limitation for the content of the photopolymerization initiators (D), but it is preferably 0.2 to 3.0 mass % relative to the total mass of the photocurable electroconductive ink composition according to the present invention. When the content is less than 0.2 mass %, the photocurable ink may remain uncured. When the content is more than 3.0 mass %, an unreacted material from the photopolymerization initiators may remain in a cured film. The unreacted material may react with the cured film upon further exposure to the sun, a fluorescent lamp and the like, resulting in a deteriorated cured film.

A sensitizer can also be used together to decrease oxygen problems in a photocuring reaction system and promote initiating reactions of the photopolymerization initiators (D). Examples of the sensitizer can include, for example, trimethylamine, triethylamine, methyldimethanolamine, triethanolamine, p-diethylamino acetophenone, p-dimethylamino ethylbenzoate, p-dimethylamino isoamylbenzoate, N,N-dimethylbenzylamine, 4,4'-bis(diethylamino)benzophenone and the like. The contents of the photopolymerization initiators and the sensitizer are within ranges where the effect of the present invention is not impaired.

In the photocurable electroconductive ink composition according to the present invention, the presence of the polymer dispersant (E) enables stabilized dispersion of the electroconductive filler (A) and improved adhesiveness of the electroconductive ink composition with a substrate.

The polymer dispersant (E) includes structural elements of a main chain backbone (a portion compatible with a resin) and an adsorption group. There is no particular limitation for the main chain backbone of the polymer dispersant, including a polyether backbone, a polyurethane backbone, a polyacrylate backbone, a polyester backbone, a polyamide backbone, a polyimide backbone, a polyurea backbone and the like. A polyurethane backbone, a polyacrylic backbone and a polyester backbone are preferred in view of the storage stability of the ink composition. There is also no particular limitation for the structure of the polymer dispersant. Examples include linear structures, random structures, block structures, comb structures, star structures, ball structures and the like. In view of the storage stability, the block structures or comb structures are preferred.

There is also no particular limitation for the adsorption group of the polymer dispersant. Examples include, for example, a carboxyl group, a phosphate group and an amino group. In particular, a polymer dispersant having an acid adsorption group such as a carboxyl group and a phosphate group is preferred.

Examples of the polymer dispersant (E) can include wet dispersing agents DISPER BYK series commercially available from BYK-Chemie Japan KK such as 101, 102, 103, 106, 108, 109, 110, 111, 112, 116, 130, 140, 142, 145, 161, 162, 163, 164, 166, 167, 168, 170, 171, 174, 180, 182, 183, 184, 185, 190, 191, 194, 2000, 2001, 2010, 2015, 2020, 2050, 2070, 2096 and 2150; EFKA series commercially available from Ciba Specialty Chemicals Inc. such as 4008, 4009, 4010, 4015, 4020, 4046, 4047, 4050, 4055, 4060, 4080, 4300, 4330, 4340, 4400, 4401, 4402, 4403, 4406, 4800, 5010, 5044, 5054, 5055, 5063, 5064, 5065, 5066, 5070 and 5244; Solsperse series commercially available from Lubrizol Japan Limited such as 3000, 11200, 13240, 13650, 13940, 16000, 17000, 18000, 20000, 21000, 24000SC, 24000GR, 26000, 28000, 31845, 32000, 32500, 32550, 32600, 33000, 34750, 35100, 35200, 36000, 36600, 37500, 38500, 39000, 53095, 54000, 55000, 56000 and 71000; DISPARLON series commercially available from Kusumoto Chemicals, Ltd. such as 1210, 1220, 1831, 1850, 1860, 2100, 2150, 2200, 7004, KS-260, KS-273N, KS-860, KS-873N, PW-36, DN-900, DA-234, DA-325, DA-375, DA-550, DA-1200, DA-1401 and DA-7301; Ajisper series commercially available from Ajinomoto Fine-Techno Co., Inc. such as PB-711, PB-821, PB-822, PN-411 and PA-111; Surfynol series commercially available from Air Products and Chemicals, Inc. such as 104A, 104C, 104E, 104H, 104S, 104BC, 104DPM, 104PA, 104PG-50, 420, 440, DF110D, DF110L, DF37, DF58, DF75, DF210, CT111, CT121, CT131, CT136, GA, TG and TGE; Flowlen series commercially available from Kyoeisha Chemical Co., Ltd. such as Flowlen D90, Flowlen G-700, Flowlen DOPA-33, Flowlen DOPA-15BHF, Flowlen DOPA-17HF and Flowlen NC-500; Olfine series commercially available from Nissin Chemical Industry Co., Ltd. such as STG and E1004; SN Sparse series commercially available from San Nopco Limited such as 70, 2120 and 2190; ADEKA Col and ADEKA Tol series commercially available from ADEKA Corporation; SANNONIC series, NAROACTY CL series, EMULMIN series, NEW-POL PE series, IONET M series, IONET D series, IONET S series, IONET T series and SANSPEARL 100 commercially available from Sanyo Chemical Industries Ltd.; and ANTIFOAM 4B Conc, ANTIFOAM KH, NFR-1000, EDP-S 6R, ED-03, LOVISGEN D-10, GD-19R and KG-406R commercially available from SENKA corporation.

There is no particular limitation for the content of the polymer dispersant (E), but it is preferably 0.01 to 0.50 mass % relative to the total mass of the photocurable electroconductive ink composition according to the present invention. A content within the above range can provide an ink composition having excellent printability and storage stability.

In addition to the above components (A) to (E), additives such as a polymerization inhibitor, a stabilizer, a colorant, a dye, an adhesiveness conferring agent, a thixotropic flame retardant and a defoaming agent may be added to the photocurable electroconductive ink composition according to the present invention, if desired, to the extents where the effect of the present invention is not impaired. Note that the photocurable electroconductive ink composition according to the present invention has a viscosity such that it can directly be used for printing, but the viscosity can be adjusted by adding a medium, if desired.

The photocurable electroconductive ink composition according to the present invention can be obtained by mixing the component (A), the component (B), the component (C), the component (D), the component (E) and other components in any order. Prompt mixing is preferred. When a colorant is used, thorough stirring is further performed to ensure homogeneity. As dispersion methods, those can be used such as two roll mills, three roll mills, sand mills, roll mills, ball mills, colloid mills, jet mills, bead mills, kneaders and homogenizers.

As an energy ray for curing the photocurable electroconductive ink composition according to the present invention, ultraviolet light, visible light, infrared light, electron beams and the like can be used, and ultraviolet light and electron beams are preferred in view of the rate of curing.

As an ultraviolet-light emitting device, a light source emitting a light in the range of 200 to 500 nm, for example, those having a high-pressure mercury lamp, an ultrahigh-pressure mercury lamp, a metal halide lamp, a gallium lamp, a xenon lamp, a carbon arc lamp and the like can be used. Alternatively, an electron-beam accelerator usually having energy of 100 to 500 eV can be used when electron beams are used for curing.

Examples of the ultraviolet-light emitting device can include ECS-1511U (Product name, Eye Graphics Co., Ltd.). Examples of preferred ultraviolet-light irradiation conditions can include a conveyor speed of 1.5 m/min., a UV lamp of 120 W/cm metal halide, an integrated light quantity of 1500 mJ/cm$^2$ and a peak illuminance of 500 mW/cm$^2$.

The photocurable electroconductive ink composition according to the present invention can suitably be used for screen printing. Electroconductive inks known in the art used for screen printing are difficult to be cured by only using ultraviolet light without applying heat. In contrast, the photocurable electroconductive ink composition according to the present invention can instantaneously be cured at room temperature.

There is no particular limitation for the material of a substrate on which the photocurable electroconductive ink composition according to the present invention is applied as long as the electroconductive ink composition can be used for screen printing. Examples can include polyvinyl chloride, polyvinyl alcohol, polyvinyl chloride, polyester, heat-shrinkable polyester, styrene resin, polyolefine, polyimide, polycarbonate, triacetyl cellulose, polyether sulfone and the like.

When the photocurable electroconductive ink composition according to the present invention is used for screen printing, a printed film usually has a thickness of 3 to 30 μm, preferably has a thickness of 5 to 20 μm. A thickness within a range of 5 to 20 μm enables sufficient hardness without decreasing adhesiveness with a substrate, and also enables reduced conduction failure.

Uses of the photocurable electroconductive ink composition according to the present invention can include, for example, RF-ID, solar cell circuits, antennae, electromagnetic wave shields, circuit boards, touch-panel electrodes, electronic circuits, precision conductor circuits, EL circuits, LED circuits, membrane wirings, GPS antennae, flexible circuits, display wirings, IC tags, wearable electronics and the like. Further, the photocurable electroconductive ink composition according to the present invention can be used on various substrates, in particular package bodies for packaging non-heat treatable foods, beverages, drugs, cosmetics, individual care products and photographic films; thin films; electrode materials; and the like for which silver pastes as excellent electric conductors have previously been difficult to be used.

EXAMPLE

Below, the present invention will be described in more detail with reference to Examples, but the present invention shall not be limited in any sense to these Examples.

Examples 1 to 7 and Comparative Examples 1 to 7

Production of Photocurable Electroconductive Ink Composition

Materials shown in Table 1 were pre-kneaded, and then kneaded with a three roll mill to prepare a photocurable electroconductive ink composition having a composition shown in Table 1 (the numerical value for each material represents mass % relative to the total mass of the corresponding composition). Materials used are as follows.

[Electroconductive fillers]
  Flake-like silver powder (the particle diameter at 50% particle size distribution (PSD): 4.7 μm, Tanaka Kikinzoku Kogyo K.K.)
  Flake-like silver powder (the particle diameter at 50% particle size distribution (PSD): 2.6 μm, Tanaka Kikinzoku Kogyo K.K.)
  Flake-like silver powder (the particle diameter at 50% particle size distribution (PSD): 1.8 μm, Tanaka Kikinzoku Kogyo K.K.)
  Flake-like silver powder (the particle diameter at 50% particle size distribution (PSD): 0.4 μm, Tanaka Kikinzoku Kogyo K.K.)
  Spherical silver powder (the particle diameter at 50% particle size distribution (PSD): 0.2 μm, Tanaka Kikinzoku Kogyo K.K.)
The particle diameters of the above silver powders were computed based on the wet particle size distribution measurements by the laser diffraction method.

[Oligomer of urethane acrylate]
  Aronix M-1960 (Product Name, Toagosei Co., Ltd.)
[Trifunctional acrylate]
Aronix M-350 (Product name, trimethylolpropane ethylene oxide-modified triacrylate, Toagosei Co., Ltd.)
[Bifunctional acrylate]
  Light Acrylate 1.6 HX-A (Product name, 1,6-hexanediol diacrylate, Kyoeisha Chemical Co., Ltd.)
  Light Acrylate 1.9 ND-A (Product name, 1,9-nonanediol diacrylate, Kyoeisha Chemical Co., Ltd.)
[Monofunctional acrylate]
  Light Acrylate PO-A (Product name, phenoxyethyl acrylate, Kyoeisha Chemical Co., Ltd.)
  Light Ester HOP-A (N) (Product name, 2-hydroxypropyl acrylate, Kyoeisha Chemical Co., Ltd.)
[Alkyd resin]
  Phthalkyd 926-70 (Product name, Hitachi Chemical Co., Ltd.)
  Arakyd 6300 (Product name, Arakawa Chemical Industries, Ltd.)
[Polyester-based acrylate resin]
  M-8030 (Product Name, Toagosei Co., Ltd.)
[Polyethylene glycol-based acrylate resin]
  A-600 (Product name, Shin-Nakamura Chemical Co., Ltd.)
[Silica]
  Aerosil 380 (Product name, Nippon Aerosil Co., Ltd.)
[Photopolymerization initiators]
  Irgacure 500 (Product name, a eutectic mixture of Irgacure 184 (Product name, 1-hydroxycyclohexylphenyl ketone) and benzophenone (a sensitizer), Ciba Specialty Chemicals Inc.)
  Irgacure 819 (Product name, bis(2,4,6-trimethylbenzoyl)-phenylphosphine oxide, Ciba Specialty Chemicals Inc.)

[Polymer dispersant]
  Disper BYK-111 (Product name, a copolymer containing an acid adsorption group, BYK-Chemie Japan KK)
  Evaluation of physical properties and functionalities
The photocurable electroconductive ink compositions prepared as above were evaluated for physical properties and functionalities.

[Viscosity and TI value]
Viscosity (Pa·s) was measured with a rotational viscometer (Brookfield AMETEK, Inc., DV-II+VISCOMETER, measured with Spindle 14, Chamber 6R) after maintained at 1 rpm for 3 minutes at a measurement temperature of 25° C., and maintained at 2.5 rpm for 15 seconds and at 5.0 rpm for 15 seconds, and maintained at 10 rpm for 1 minute. Results are shown in Table 2.

Further, values of the thixotropy index (TI) were computed from the measured values of viscosity at 1 rpm under the above conditions and the measured values of viscosity similarly measured at 10 rpm. Results are shown in Table 2.
TI value=(viscosity at 1 rpm)/(viscosity at 10 rpm)
A viscosity value of 150 (Pa·s) or less as determined above and a TI value of 8.5 or less tend to enable good printability and printing precision in screen printing.

[Functionality evaluation]
Electroconductive circuit patterns with line widths of 50 μm, 70 μm, 100 μm and 150 μm (2 lines each with a length of 2 cm and a width between lines of 110 μm) were printed on PET films (printing conditions: 200 mm/s, gap +0.7 mm, squeegee printing pressure 0.2 MPa, squeegee attack angle 70 degrees) by screen printing with a screen printer (Product name: LS-15TV, Newlong Seimitsu Kogyo Co., Ltd). Then, irradiation/curing was performed at room temperature using UV (ultraviolet light) as an photoactive ray (UV conditions: integrated light quantity 1500 mJ/cm$^2$, peak illuminance 500 mW/cm$^2$). The film thickness (μm), fine line property, surface smoothness and specific resistance value (mΩ·cm) after curing were evaluated. The above film thickness was measured with a film thickness measuring instrument Digital Micrometer (Product name, Mitutoyo Corp.). For the above fine line property, 50 positions in a line of each line width were randomly observed under a light microscope to check for the presence or absence of one or more broken lines or defective line widths. The property was evaluated as poor if these are present while as good if not. A line width was evaluated as poor if the actual line width printed and cured with UV differed from the target line width by 40% or more. For the above surface smoothness, 50 positions in a line of each line width were randomly observed under a light microscope and evaluated as follows: Very Good (V) if no mesh trace was observed; Good (G) if 1 to 4 mesh traces were observed; Fair (F) if 5 to 9 mesh traces were observed; and Poor (P) if 10 or more mesh traces were observed. The above specific resistance values were measured with a resistance meter Milliohm HiTester 3540 (Product name, HIOKI E. E. Corporation). Results are shown in Table 2.

TABLE 1

|  |  |  | Example | | | | | | | Comparative Example | | | | | | |
| --- | --- | --- | --- | --- | --- | --- | --- | --- | --- | --- | --- | --- | --- | --- | --- | --- |
|  | Materials | Types and property values | 1 | 2 | 3 | 4 | 5 | 6 | 7 | 1 | 2 | 3 | 4 | 5 | 6 | 7 |
| Composition (parts by mass) | Electroconductive filler | Flake-like silver powder, particle diameter at 50% PSD: 4.7 mm |  |  |  |  |  |  |  | 79.0 |  |  |  |  |  |  |

TABLE 1-continued

| Materials | Types and property values | Example 1 | 2 | 3 | 4 | 5 | 6 | 7 | Comparative Example 1 | 2 | 3 | 4 | 5 | 6 | 7 |
|---|---|---|---|---|---|---|---|---|---|---|---|---|---|---|---|
| | Flake-like silver powder, particle diameter at 50% PSD: 2.6 mm | 39.5 | 77.0 | | | 39.5 | 42.0 | 40.5 | | 40.5 | 39.5 | 39.5 | 39.5 | | 34.0 |
| | Flake-like silver powder, particle diameter at 50% PSD: 1.8 mm | | | | 79.0 | | | | | | | | | | |
| | Flake-like silver powder, particle diameter at 50% PSD: 0.4 mm | 39.5 | | 71.0 | | 39.5 | 42.0 | 40.5 | | 40.5 | 39.5 | 39.5 | 39.5 | | 34.0 |
| | Spherical silver powder, particle diameter at 50% PSD: 0.2 mm | | | | | | | | | | | | | 71.0 | |
| Oligomer of urethane acrylate | Aronix M-1960 | 3.3 | 2.7 | 4.8 | 3.3 | 3.3 | 1.4 | 3.0 | 3.3 | 3.8 | 3.3 | 3.3 | 3.9 | 4.8 | 4.6 |
| Trifunctional acrylate | Aronix M-350 | 4.1 | 3.5 | 6.3 | 4.1 | 4.1 | 4.7 | 3.7 | 4.1 | 4.6 | 4.1 | 4.1 | 4.8 | 6.9 | 6.0 |
| Bifunctional acrylate | Light Acrylate 1.6 HX-A Light Acrylate 1.9 ND-A | 3.3 | 2.9 | 5.5 | 3.3 | 3.3 | 3.7 | 3.0 | 3.3 | 3.7 | 3.3 | 3.3 | 3.9 | 6.6 | 5.5 |
| Monofunctional acrylate | Light Acrylate PO-A Light Ester HOP-A (N) | 4.2 | 3.7 | 6.5 | 4.2 | 4.2 | 4.2 | 3.8 | 4.2 | 4.9 | 4.2 | 4.2 | 5.1 | 7.2 | 6.3 |
| Alkyd resin | Phthalkyd 926-70 | 4.8 | 9.2 | 3.3 | 4.8 | | 1.3 | 4.3 | 4.8 | | | | | 1.5 | 7.0 |
| | Arakyd 6300 | | | | | 4.8 | | | | | 4.8 | | | | |
| Polyester-based acrylate resin | M-8030 | | | | | | | | | 4.8 | | | | | |
| Polyethylene glycol-based acrylate resin | A-600 | | | | | | | | | | | 4.8 | | | |
| Silica | Aerosil 380 | | | | | | | | | | | | 2.0 | | |
| Photo-polymerization initiators | Irgacure 500 | 0.4 | 0.3 | 0.8 | 0.4 | 0.4 | 0.2 | 0.4 | 0.4 | 0.6 | 0.4 | 0.4 | 0.4 | 0.6 | 0.8 |
| | Irgacure 819 | 0.8 | 0.6 | 1.4 | 0.8 | 0.8 | 0.4 | 0.7 | 0.8 | 1.2 | 0.8 | 0.8 | 0.8 | 1.3 | 1.4 |
| Polymer dispersant | Disper BYK-111 | 0.1 | 0.1 | 0.4 | 0.1 | 0.1 | 0.1 | 0.1 | 0.1 | 0.2 | 0.1 | 0.1 | 0.1 | 0.1 | 0.4 |

TABLE 2

| | | Example 1 | | | | Example 2 | | | | Example 3 | | | | Example 4 | | | |
|---|---|---|---|---|---|---|---|---|---|---|---|---|---|---|---|---|---|
| Physical properties | Viscosity (Pa·s) | 76 | | | | 65 | | | | 53 | | | | 77 | | | |
| | TI value | 6.9 | | | | 6.7 | | | | 6.3 | | | | 6.8 | | | |
| Functionality | Line width (μm) | 50 | 70 | 100 | 150 | 50 | 70 | 100 | 150 | 50 | 70 | 100 | 150 | 50 | 70 | 100 | 150 |
| | Film thickness (μm) | 7 | 9 | 11 | 13 | 6 | 8 | 10 | 12 | 5 | 7 | 9 | 12 | 8 | 9 | 11 | 12 |
| | Fine line property | G | G | G | G | G | G | G | G | G | G | G | G | G | G | G | G |
| | Surface smoothness | V | V | V | V | V | V | V | V | V | G | G | G | G | V | V | V |
| | Specific resistance (mΩ·cm) | 1.5 | 0.9 | 0.7 | 0.7 | 2.2 | 1.1 | 0.9 | 0.8 | 5.7 | 3.8 | 2.2 | 1.7 | 0.9 | 0.7 | 0.5 | 0.4 |

| | | Example 5 | Example 6 | Example 7 |
|---|---|---|---|---|
| Physical properties | Viscosity (Pa·s) | 70 | 95 | 94 |
| | TI value | 6.1 | 7.4 | 8.4 |

TABLE 2-continued

| | | | | | | | | | | | | | |
|---|---|---|---|---|---|---|---|---|---|---|---|---|---|
| Functionality | Line width (μm) | 50 | 70 | 100 | 150 | 50 | 70 | 100 | 150 | 50 | 70 | 100 | 150 |
| | Film thickness (μm) | 6 | 8 | 10 | 11 | 10 | 12 | 14 | 16 | 9 | 11 | 13 | 14 |
| | Fine line property | G | G | G | G | G | G | G | G | G | G | G | G |
| | Surface smoothness | V | V | V | V | G | G | G | G | G | G | G | G |
| | Specific resistance (mΩ·cm) | 1.7 | 1.1 | 0.8 | 0.7 | 0.3 | 0.2 | 0.2 | 0.2 | 0.4 | 0.2 | 0.2 | 0.1 |

| | | Comparative Example | | | | | | | | | | | | | | | |
|---|---|---|---|---|---|---|---|---|---|---|---|---|---|---|---|---|---|
| | | 1 | | | | 2 | | | | 3 | | | | 4 | | | |
| Physical properties | Viscosity (Pa·s) | 20 | | | | 108 | | | | 81 | | | | 83 | | | |
| | TI value | 4.7 | | | | 5.7 | | | | 6.2 | | | | 9.4 | | | |
| Functionality | Line width (μm) | 50 | 70 | 100 | 150 | 50 | 70 | 100 | 150 | 50 | 70 | 100 | 150 | 50 | 70 | 100 | 150 |
| | Film thickness (μm) | 5 | 7 | 8 | 10 | 10 | 12 | 14 | 16 | 6 | 9 | 11 | 13 | 6 | 8 | 10 | 13 |
| | Fine line property | P | P | P | P | P | P | P | P | P | P | P | P | P | P | P | P |
| | Surface smoothness | P | P | P | P | P | P | P | P | P | F | F | F | P | F | F | F |
| | Specific resistance (mΩ·cm) | 7.2 | 3.9 | 2.7 | 2.4 | 1.1 | 0.8 | 0.7 | 0.6 | 4.7 | 3.9 | 2.2 | 1.9 | 6.1 | 4.8 | 2.1 | 1.6 |

| | | Comparative Example | | | | | | | | | | | |
|---|---|---|---|---|---|---|---|---|---|---|---|---|---|
| | | 5 | | | | 6 | | | | 7 | | | |
| Physical properties | Viscosity (Pa·s) | 380 | | | | 51 | | | | 46 | | | |
| | TI value | 3.1 | | | | 6.9 | | | | 6.7 | | | |
| Functionality | Line width (μm) | 50 | 70 | 100 | 150 | 50 | 70 | 100 | 150 | 50 | 70 | 100 | 150 |
| | Film thickness (μm) | 11 | 13 | 14 | 16 | 6 | 7 | 8 | 9 | 5 | 7 | 8 | 8 |
| | Fine line property | P | P | P | P | P | P | P | P | P | P | P | P |
| | Surface smoothness | P | P | P | P | P | P | P | P | P | P | P | P |
| | Specific resistance (mΩ·cm) | 24.2 | 10.9 | 7.3 | 6.9 | 9.2 | 6.3 | 3.2 | 2.9 | 31.2 | 18.6 | 13.7 | 12.6 |

V: Very Good;
G: Good;
F: Fair;
P: Poor

The above results revealed that the photocurable electroconductive ink composition according to the present invention enabled good printability and printing precision in screen printing, and further showed stable electroconductive properties.

The invention claimed is:

1. A photocurable electroconductive ink composition for screen printing, the composition comprising:
   (A) an electroconductive filler;
   (B) a photopolymerizable resin precursor consisting of an oligomer of urethane acrylate, monofunctional acrylate and polyfunctional acrylate;
   (C) an alkyd resin;
   (D) two or more photopolymerization initiators; and
   (E) a polymer dispersant,
   a. wherein the content of the electroconductive filler (A) is 70 to 90 mass % relative to the total mass of the photocurable electroconductive ink composition, and more than 50 mass % of the electroconductive filler is silver powder in a scale-like, foil-like or flake-like form having a particle diameter at 50% particle size distribution of 0.3 to 3.0 μm,
   b. the content of the photopolymerizable resin precursor (B) is 10 to 24 mass % relative to the total mass of the photocurable electroconductive ink composition, and the content of the oligomer of urethane acrylate is 5 mass % or less relative to the total mass of the photocurable electroconductive ink composition, and
   c. the content of the alkyd resin (C) is 1 to 10 mass % relative to the total mass of the photocurable electroconductive ink composition.

2. The photocurable electroconductive ink composition for screen printing according to claim 1, wherein the contents of the photopolymerization initiators (D) and the polymer dispersant (E) are 0.2 to 3.0 mass % and 0.01 to 0.50 mass %, respectively relative to the total mass of the photocurable electroconductive ink composition.

3. The photocurable electroconductive ink composition for screen printing according to claim 1, wherein the polyfunctional acrylate is a bifunctional acrylate or a trifunctional acrylate.

4. The photocurable electroconductive ink composition for screen printing according to claim 1, wherein the alkyd resin (C) is inactive in a photopolymerization reaction.

5. A printed circuit board, wherein the photocurable electroconductive ink composition according to claim 1 is printed on a substrate by screen printing.

6. A method of manufacturing a printed circuit board, the method comprising: printing the photocurable electroconductive ink composition according to claim 1 on a substrate and performing curing by applying ultraviolet light at room temperature without performing heat curing.

7. The photocurable electroconductive ink composition for screen printing according to claim 2, wherein the polyfunctional acrylate is a bifunctional acrylate or a trifunctional acrylate.

8. The photocurable electroconductive ink composition for screen printing according to claim 2, wherein the alkyd resin (C) is inactive in a photopolymerization reaction.

9. The photocurable electroconductive ink composition for screen printing according to claim 3, wherein the alkyd resin (C) is inactive in a photopolymerization reaction.

10. A printed circuit board, wherein the photocurable electroconductive ink composition according to claim 2 is printed on a substrate by screen printing.

11. A printed circuit board, wherein the photocurable electroconductive ink composition according to claim 3 is printed on a substrate by screen printing.

12. A printed circuit board, wherein the photocurable electroconductive ink composition according to claim 4 is printed on a substrate by screen printing.

13. A method of manufacturing a printed circuit board, the method comprising: printing the photocurable electroconductive ink composition according to claim 2 on a substrate and performing curing by applying ultraviolet light at room temperature without performing heat curing.

14. A method of manufacturing a printed circuit board, the method comprising: printing the photocurable electroconductive ink composition according to claim 3 on a substrate and performing curing by applying ultraviolet light at room temperature without performing heat curing.

15. A method of manufacturing a printed circuit board, the method comprising: printing the photocurable electroconductive ink composition according to claim 4 on a substrate and performing curing by applying ultraviolet light at room temperature without performing heat curing.

* * * * *